United States Patent [19]

Harris et al.

[11] Patent Number: 5,900,648
[45] Date of Patent: * May 4, 1999

[54] SEMICONDUCTOR DEVICE HAVING AN INSULATED GATE

[75] Inventors: Christopher Harris, Sollentuna; Andrei Konstantinov, Linköping; Erik Janzén, Borensberg, all of Sweden

[73] Assignee: ABB Research Ltd., Zurich, Switzerland

[*] Notice: This patent issued on a continued prosecution application filed under 37 CFR 1.53(d), and is subject to the twenty year patent term provisions of 35 U.S.C. 154(a)(2).

[21] Appl. No.: 08/829,481

[22] Filed: Mar. 28, 1997

Related U.S. Application Data

[63] Continuation of application No. 08/435,487, May 5, 1995, abandoned.

[30] Foreign Application Priority Data

Dec. 22, 1994 [SE] Sweden ................................ 9404452

[51] Int. Cl.$^6$ ................. H01L 31/0312; H01L 31/0256; H01L 29/76; H01L 29/94
[52] U.S. Cl. ............................. 257/77; 257/76; 257/410
[58] Field of Search .............................. 257/76, 77, 410, 257/613, 629

[56] References Cited

U.S. PATENT DOCUMENTS

| | | | |
|---|---|---|---|
| 3,692,700 | 9/1972 | Low et al. ............................. | 257/411 |
| 4,849,797 | 7/1989 | Ukai et al. ............................ | 357/237 |
| 5,107,315 | 4/1992 | Kumagai et al. . | |
| 5,135,885 | 8/1992 | Furukawa et al. . | |
| 5,184,199 | 2/1993 | Fujii et al. . | |
| 5,258,631 | 11/1993 | Usagawa et al. ...................... | 257/192 |
| 5,326,992 | 7/1994 | Yoder ..................................... | 257/77 |
| 5,382,822 | 1/1995 | Stein ...................................... | 257/410 |
| 5,539,217 | 7/1996 | Edmond et al. ....................... | 257/77 |
| 5,597,744 | 1/1997 | Kamiyama et al. ................... | 437/40 |
| 5,614,749 | 3/1997 | Ueno ..................................... | 257/330 |

FOREIGN PATENT DOCUMENTS

| | | |
|---|---|---|
| 2707425 A1 | 1/1995 | France . |
| 4323814 A1 | 3/1994 | Germany . |

OTHER PUBLICATIONS

S. W. Amos and R. S. Amos, Newnes Dictionary of Electronics, p. 336, Dec. 1996.

Fathimulla et al., "Reactively Rf Magnetron Sputtered AlN Films as Gate Dielectric", J. Appl. Phys., vol. 54, No. 8, Aug. 1983, pp. 4586–4589.

Proceedings of IEEE, vol. 79, No. 5, 1991, Robert F. Davis, "III–V Nitrides for Electronic and Optoelectronic Applications."

Kopanski et al., "Charge Trapping in Cubic Silicon Carbide MIS Capacitors", Springer Proceedings in Phys., vol. 56, pp. 119–124, 1992.

Suzuki et al., "Crystal Growth of β–SiC on Si and Its Application to MOSFETs", Springer Proceedings in Phys., vol. 56, pp. 101–110, 1992.

Khan et al., "High Electron Mobility Transistor Based on a GaN–Al$_x$Ga$_{1-x}$N Heterojunction", Appl. Phys. Lett 63, (9), Aug. 93, pp. 1214–1215.

Strite et al., "GaN, AiN and InN: A Review", J. Vac. Sci. Technol. B 10(4), Jul./Aug. 1992, pp. 1237, 1255, 1260, 1261, and 1263–1266.

*Primary Examiner*—Mahshid Saadat
*Assistant Examiner*—Allan R. Wilson
*Attorney, Agent, or Firm*—Pollock, Vande Sande & Amernick

[57] ABSTRACT

A semiconductor device comprises a semiconductor layer of SiC and an insulating layer thereon for insulating the SiC layer with respect to a metal plate constituting a gate and connectable to a voltage for creating a conducting surface channel at a SiC layer-insulating layer interface, wherein at least a portion of the insulating layer closest to the interface is made of a crystalline material which is substantially lattice-matched to SiC and has substantially the same coefficient of thermal expansion as SiC; and wherein the material has AlN as the only component or as a major component of an alloy with insulating properties.

14 Claims, 3 Drawing Sheets

SEMICONDUCTOR DEVICE HAVING AN INSULATED GATE

This application is a Continuation of U.S. patent application Ser. No. 08/435,487, filed May 5, 1995, now abandoned.

FIELD OF THE INVENTION

The present invention relates to a semiconductor device comprising a semiconductor layer of SiC and an insulating layer thereon for insulating the SiC layer with respect to a metal plate constituting a gate and connectable to a voltage for creating a conducting surface channel at the SiC layer-insulating layer interface.

BACKGROUND OF THE INVENTION

All types of gate-controlled semiconductor devices having an insulated gate are included, such as for example IGBTs, MOSFETs, vertical MISFETs and MIS-gated thyristors.

Such devices are particularly used in applications in which it is possible to benefit by the superior properties of SiC in comparison with especially Si, namely the capability of SiC to function well under extreme conditions. SiC has a high thermal stability due to a large band gap between the valence band and the conduction band, so that it will have a stable function at much higher temperatures than Si, namely well up to 1000K. Furthermore, it has a high thermal conductivity, so that SiC devices may be arranged at a high density. SiC also has a more than 5 times higher breakdown field than Si, so that it is well suitable as material in high power devices operating under conditions where high voltages may occur in the reverse direction of the device.

There are over 250 polytypes of SiC, and the most important ones are 3C, 4H, 6H and 15R, since good species thereof may be produced without any complications. The CVD-technique may preferably be used for the production of such SiC crystals. $SiO_2$ has until now primarily been used as a material for the insulating layer of semiconductor devices of the type defined above. However, the conductivity of the channel created at the interface in such devices is not as high as desired, so that the on-slate-current capability of such devices is limited. This is due to the comparatively high trapping density at the interface between the SiC and $SiO_2$ layers. Accordingly, the charge carriers (electrons or positive holes) are scattered at the interface as a result of these traps. An increase of the gate voltage increases the carrier density in the conducting channel, but this advantage is counteracted by the resulting limited carrier mobility. Furthermore, increasing the gate voltage above a certain limit will besides an extensive scattering of the carriers at the interface procure tunnelling of the carriers into the dielectric reducing the current in the channel. $SiO_2$ has thereto a breakdown field not adapted to the conditions under which SiC itself may function well.

SUMMARY OF THE INVENTION

The object of the present invention is to find a remedy for the above disadvantages by providing a semiconductor device having an improved surface channel conductivity in the forward state as compared with devices of this type already known.

This object is in accordance with the present invention obtained by making at least a portion of the insulating layer closest to the interface of a crystalline material which is substantially lattice-matched to SiC and has substantially the same coefficient of thermal expansion as SiC.

By using a crystalline material with these properties for forming the interface between the insulating layer and the SiC layer in this type of semiconductor devices the surface of the SiC layer may be given a very good order, so that it obtains a nearly "bulk-like"-character. Accordingly, the disorder and by that the trapping density at the interface is dramatically reduced with respect to the use of amorphous $SiO_2$ as an insulating layer, which in its turn results in a considerably higher channel conductivity with nearly no interface scattering at a given gate voltage since the carriers are only scattered on imperfections in a crystalline material; whereas, the amorphous $SiO_2$ results in a very high scattering because of its disordered nature, and a higher gate voltage may be applied than in the case of $SiO_2$ case and accordingly a higher carrier density may be obtained before saturation of the forward current in the channel. In fact, an increase of mobility in the channel may be expected compared to a bulk material, since no donors or acceptors need to be provided in the channel to supply free carriers. The lattice matching of the material with SiC means that crystallographically equivalent crystal planes of the material and SiC have substantially the same period. Thanks to substantially the same coefficient of thermal expansion as SiC this material has the same temperature behavior as SiC and may therefore ensure a good function at different temperatures as well as be produced at the same high temperature as the SiC crystal without causing any disorders when cooling down. It is sufficient for the device operation that the portion of the insulating layer closest to the interface is made of such material, but it will be suitable and in the practice probably mostly the case to produce the entire insulating layer of this material. Furthermore, a crystal is typically much more stable than an amorphous material, so that the temperature stability and reliability of the device are improved.

According to a preferred embodiment of the present invention the material has placed next to the SiC of the semiconductor layer a higher energy level of the conduction band at the interface than the energy level of the conduction band of the SiC semiconductor at the interface. This band-offset provides a barrier for electron penetration from SiC into the insulating material and makes it possible to increase the gate voltage to a high level sufficient to induce free carrier charge at the interface and at the same time prevent the channel electrons from being transferred to the insulating layer either by thermal activation or by tunnelling, so that high channel carrier densities may be achieved. This embodiment is accordingly well suited for electrons as charge carriers.

According to another preferred embodiment of the invention the material has placed next to the SiC of the semiconductor layer a lower energy level of the valence bard at the interface than the energy level of the valence band of the SiC semiconductor at the interface and the selection of such a material results in the advantages related to the band-offset mentioned above when positive holes are used as carriers, i.e. the SiC semiconductor layer is N-doped and a negative voltage is applied to the gate of the semiconductor device.

According to a still further, very preferred embodiment of the invention the material is AlN. AlN is well suited as a material for the insulating layer, since it has a very good lattice match with SiC with a misfit of only 0.7%. It does also have nearly the same coefficient of thermal expansion as SiC and it is stable at high temperatures. AlN has a 2H structure and will match very well with all types of SiC polytypes, both cubic as 3C and hexagonal as 4H and 6H ones. As a way of a non limitative example it may be mentioned that for instance the polytypes 6H, 4H, 15R and 3C of SiC certain chosen crystal plains have exactly the same stacking order of atoms as in the 2H structure of AlN. For the polytypes 6H, 4H and 15R the orientations of perfect lattice matching correspond to the crystal planes [0001] or [000$\bar{1}$] in the Bravais' indexing system. For the cubic polytype 3C the crystal-lographic planes equivalent to [0001] and [000$\bar{1}$] of the 2H structure of AlN are [111] and [$\bar{1}\bar{1}\bar{1}$] correspondingly, where are [111] and [$\bar{1}\bar{1}\bar{1}$] the notations of crystal planes in the Miller's indexing system used for the crystals with a cubic symmetry. Furthermore, AlN has already been grown with a high quality on SiC, as described by R. F. Davis, Proc. IEEE 79, 702 (1991). AlN has a high breakdown field allowing high voltages to be applied. Furthermore, AlN has a band gap of about 6.2 eV, which is considerable larger than all polytypes of SiC, which have band gaps between 2.3 and 3.3 eV. AlN has energy band offsets of the type for both the conduction band and the valence band for all the SiC polytypes, so that the channel at the interface must have excellent conducting capabilities in devices employing electrons as well as those with holes as majority carriers in the channel. Thanks to the large band-offset between SiC and AlN coupled with the dielectric strength, i.e. the high breakdown field, of these materials very high electric fields may be applied to the gate insulation and by that high surface channel carrier densities may be achieved.

According to another preferred embodiment of the invention the material is one of or a combination of Group 3B-nitrides and SiC. The other Group 3B-nitrides other than AlN have a lattice match with SiC being not as good as AlN, but they may possibly be preferred in certain applications, in which it may for instance be suitable to have a high concentration of AlN and a lower concentration of one or more of the other Group 3B-nitrides. Gallium nitride, aluminium nitride and indium nitride have a complete miscibility. However, the other nitrides other than AlN have smaller gaps between valence band and the conduction band, so that the advantages of the large band-offset set forth above may not be achieved. Furthermore, it is essential to compose such an alloy composition so that it remain an insulator, which according to another preferred embodiment of the invention is achieved by selecting AlN as the major component of the alloy composition. Accordingly, the mixing is done so that the composition will be located at the "right" side of a transition point between good insulating properties and not.

BRIEF DESCRIPTION OF THE DRAWINGS

With reference to the appended drawings, below follows a specific description of preferred embodiments of the invention cited as examples.

In the drawings.

DETAILED DESCRIPTION OF THE PREFERRED EMBODIMENTS

Figure 1:
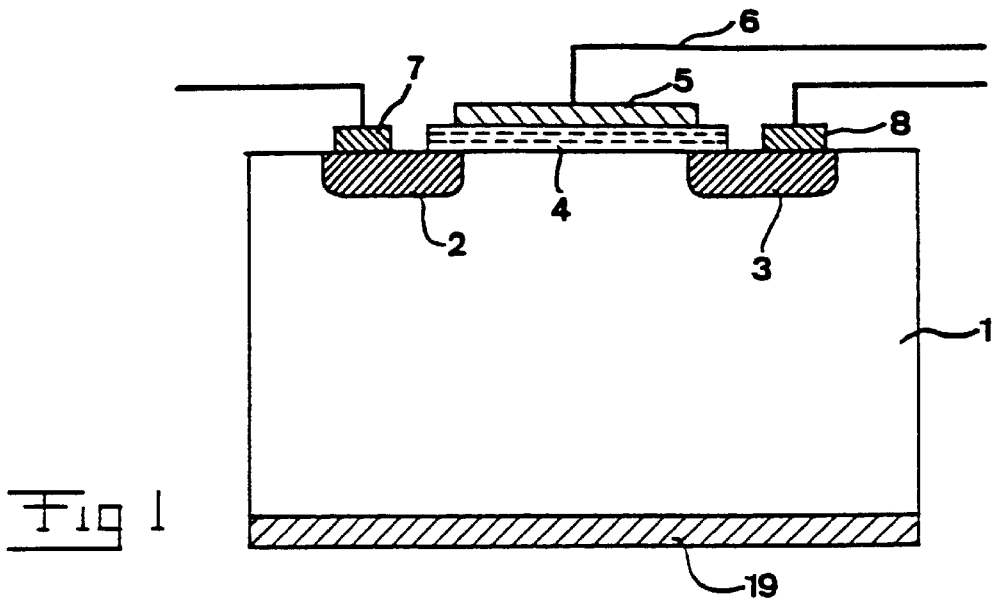
FIG. 1 is a schematical view of a planar MISFET (Metal-Insulator-Semiconductor Field Effect Transistor) according to a first preferred embodiment of the invention.

FIG. 1 illustrates a planar MISFET to which the invention is applied. The IGBT has a SiC-substrate or a base region 1 of P-type. 6H-SiC is used here. The substrate does also comprises a source region 2 of N$^+$-type and a drain region 3 of N$^+$-type. The drain and source regions can be formed by room-temperature ion-implantation of nitrogen with subsequent damage annealing at 1400° C. The source region and the drain region are separated by a portion of the substrate upon which an insulating layer 4 of monocrystalline AlN is applied. A metal plate 5 constituting the gate of the device is applied on the opposite side of the insulating layer and connectable to a voltage through a conductor 6. The source region 2 and the drain region 3 are also provided with metal contacts 7 and 8, respectively. For a standard plug-in circuit of a FET device with election-type channel the source is grounded and a positive bias is applied to the drain. It is preferrable to provide a grounding to the substrate by a contact metal electrode 19 to prevent its potential from floating. A positive bias applied to the gate induces a channel at the semiconductor-insulator interface and turns on the current flow between source and drain. If no gate bias is applied the current flow is blocked by the potential barriers of the two p-n junctions between substrate and source and substrate and drain. It is well possible to make the substrate N-doped and the source and drain regions P$^+$-doped instead to provide a possibility to apply a negative bias to the gate. Accordingly, there is a first semiconductor region 1 of one conduction type, onto which an insulating region 4 is applied and a second 2 and third 3 semiconductor region, which have a conduction type opposite to that of the first semiconductor region, residing adjacent to and carrying therebetween the first semiconductor region. When a voltage is applied between the metal contacts 7 and 8 of the source and drain region, one of the two PN-junctions blocks and prevents a current from flowing from the source to the drain, but if at the same time a positive voltage is applied to the gate 5 there will flow a current from the source to the drain in a two-dimensional surface channel formed in the substrate 1 at the interface between the substrate and the insulating layer 4. This is because the positive voltage of the gate will attract electrons to the interface to form an induced channel at the interface having a carrier density increasing with the gate voltage. When there is no bias on the gate, only a low leakage current flows between the source and drain electrodes.

Figure 2A:
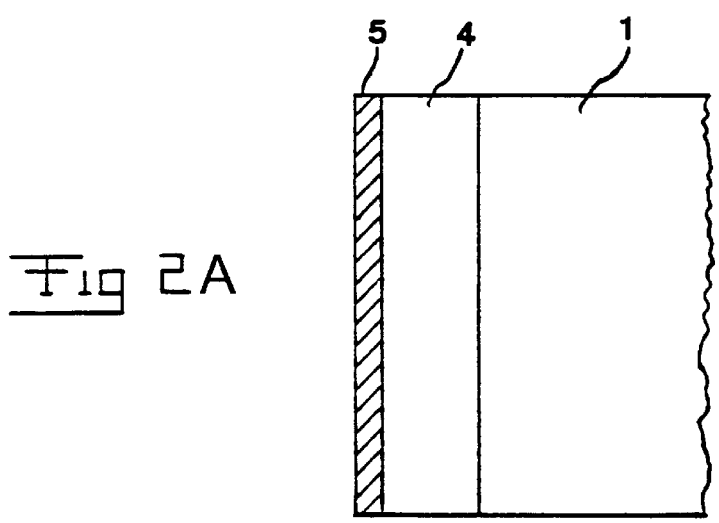
FIGS. 2A and 2B are enlarged views of the gate structure of a semiconductor device according to the invention having AlN as material of the insulating layer showing the extension of the valence and conduction bands in the insulating layer and in SiC near the interface therebetween when no voltage is applied to the gate, FIG. 3 corresponds to FIGS. 2A and 2B, but shows the extension of the valence and conduction bands when a bias is applied to the gate of the device so as to form an electron channel at the SiC-AlN interface.
Figure 2B:
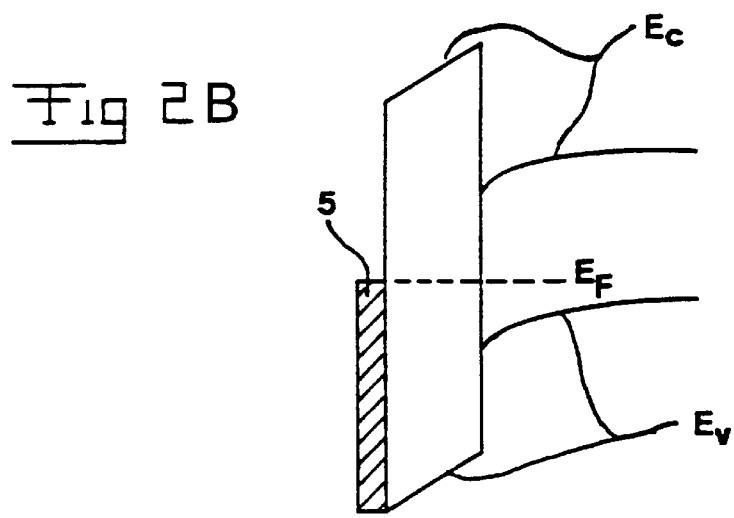
Figure 3:
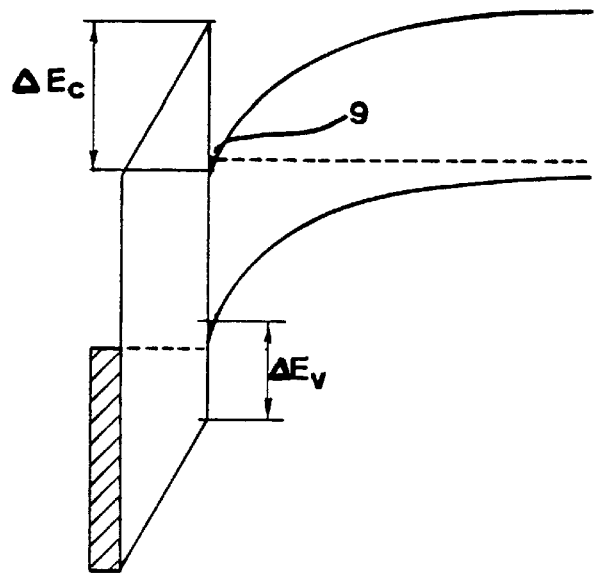

The gap between the valence band and the conduction band in 6H-SiC is 2.9 eV, whereas the corresponding gap is 6.2 eV in AlN. FIGS. 2A and 2B illustrates the extensions of the valence and conduction bands in the insulating layer 4 of AlN and in the substrate 1 close to the interface between the substrate and the insulating layer. Due to the fact that the Fermi-energy level has to be the same in the insulating layer and the substrate there will be a downward step in the conduction band at the interface. The opposite thing is valid for the valence band. FIG. 3 shows how the valence and conduction bands will be bent when a bias is applied to the gate. The application of a positive gate voltage will result in an inversion channel 9 at the interface with a very high carrier (electron) density. Thus, thanks to the band-offset between SiC and AlN an energy barrier $\Delta E_C$ is formed at the interface, so that a very high gate voltage may be applied without any substantial thermal activation or tunnelling of electrons into the insulating layer. Thanks to the high dielectric constant of AlN (twice as high as SiO$_2$) very high gate voltages may be applied before a detrimental restriction of carrier mobility, damages of the device or electric breakdowns occur. The thermal stability, crystalline nature and good lattice match of AlN to SiC also contribute thereto by providing a much lower interface trapping density than if SiO$_2$ had been used as material for the insulating layer. In the case of the substrate or base of N-type and source and drain regions of P$^+$-type the band off-set between the valence bands of AlN and SiC will be used to create a corresponding inversion channel for conducting positive holes at the interface.

One embodiment of the invention is a planar MISFET with a semi-insulating substrate. The preferred device structure is the same as shown in FIG. 1 and described above in relation thereto except that the substrate 1 is now made of a semi-insulating silicon carbide. Such a material can be obtained by growing a material with a very low impurity concentration or by overcompensation of the background dopants by deep impurity or defect center with energy level depth higher than 0.6 eV. A number of deep center are known to be produced in silicon carbide by impurity doping and high-energy particle irradiation. The background carrier concentration in a semi-insulating layer is sufficiently low to provide a low current flow in the substrate except for the interface region of SiC and AlN. It must be noted that the majority carriers of the device can be either electrons or holes, depending on the residual material doping or on the position in the energy gap of SiC of the energy levels of the deep center used for overcompensation. The type of residual majority carriers is however of a minor importance for the operation of the device, because the carriers provide only a very low conductivity. The operation principle of the device is essentially the same as of that described above, and the main difference in its description originates from the difference in terminology. The interfaces of regions 1 and 2 and 1 and 3 are not junctions, they are p-n type interfaces. The device has a much higher operation speed than that described above out of much lower parasitic capacitances.

Figure 4:
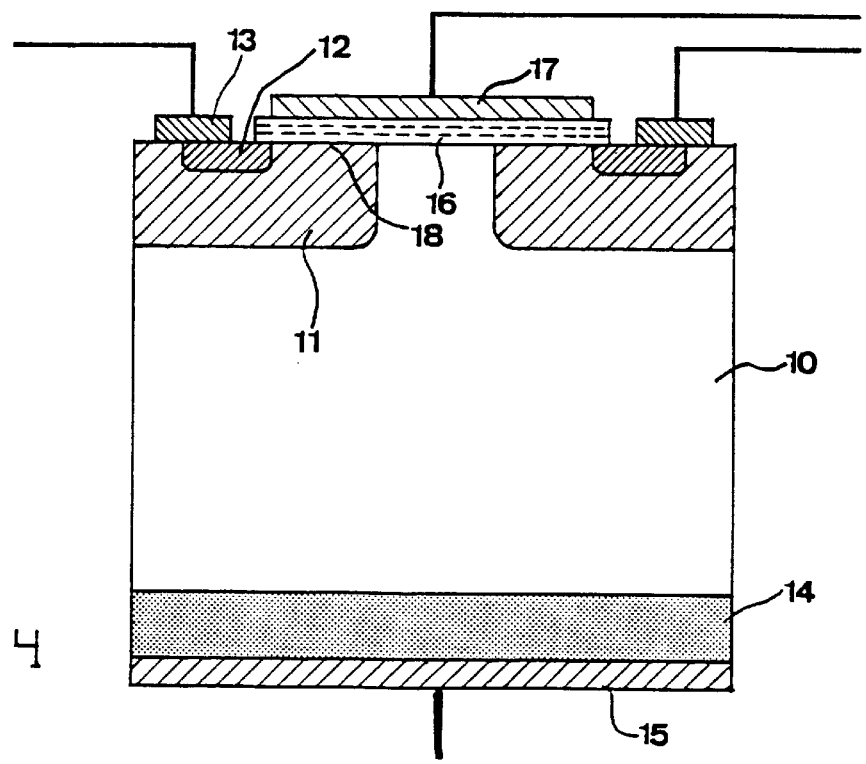
FIG. 4 is a schematic view of a vertical MISFET as a semiconductor device according to a second preferred embodiment of the invention.
Figure 5:
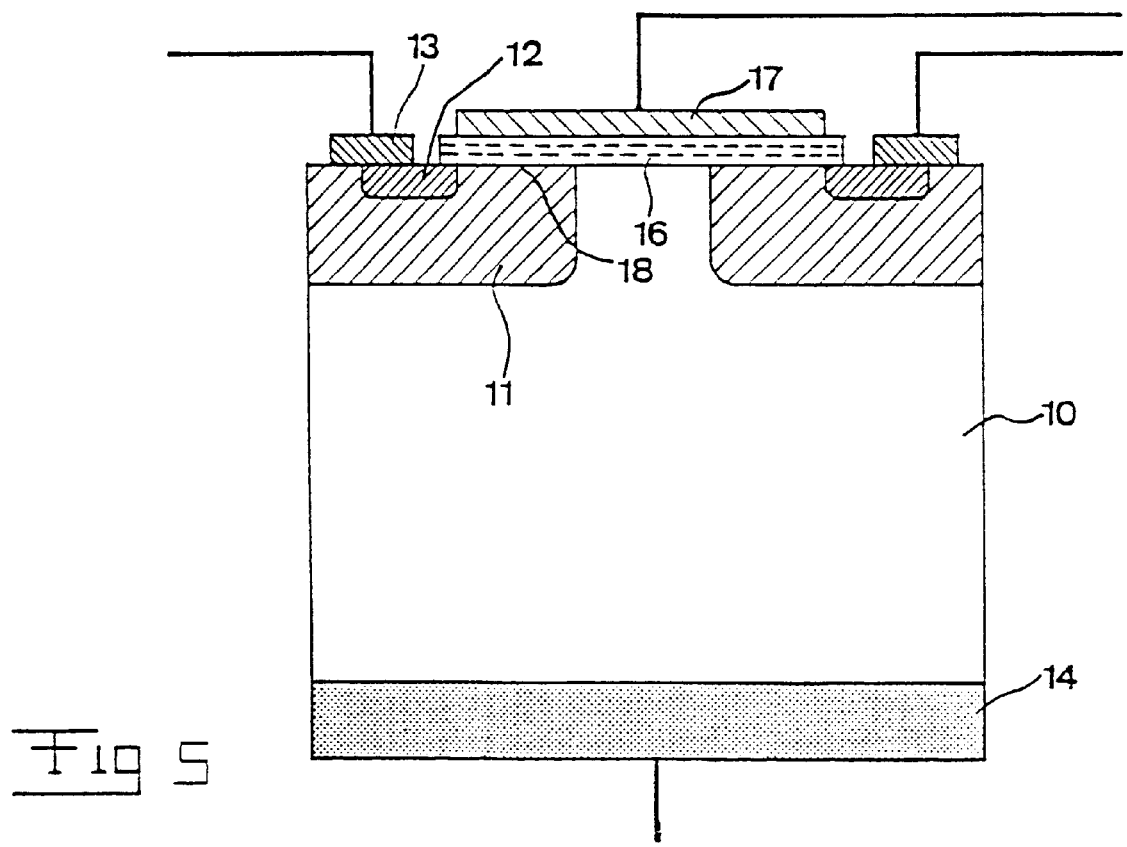
FIG. 5 shows a unipolar device.

FIG. 4 illustrates a vertical MISFET to which the invention is applied. This is also made of SiC as semiconductor material with a lightly doped base 10 of N-type. There is also a region 11 of P-type surrounding a source region 12 being lightly N-doped and the drift layer. The source region is connectable to a voltage through a metal ohmic plate 13. There is also a contact region 14 of N-type and a drain metal ohmic plate 15. An insulating layer 16 of AlN is applied upon the surface opposite to the drain metal plate over the P-type region 11.

The device can have a number of adjacent cells identical to that shown in FIG. 4, and the particular example of a cell shown in FIG. 4 is symmetric. A further metal plate or gate 17 is arranged on the opposite side of the insulating layer 16 and connectable to a voltage for applying a positive gate voltage so as to create an inversion channel at the interface 18 between the insulating layer 16 and the region 11 in the way described above, so that a current may flow from the source metal plate 13 to the drain metal plate 15 when a corresponding voltage is applied thereto. Due to the low doping of the base 10 this device can withstand a high voltage when there is no bias at the gate.

Another embodiment is a vertical IGBT, the Insulated Gate Bipolar Transistor to which the invention is applied. The device is illustrated by the same FIG. 4, however the layer 14 is a heavily doped P-type layer. The change turns the vertical MISFET device into a bipolar transistor. As is known to those skilled in the art, the IGBT is a bipolar device, that is a device in which the current flow is determined by injection of non-equilibrium minority carriers, holes in the particular type of IGBT considered in the present embodiment. The anode region 14 of the device functions as emitter, and the P-type doped region 11 functions as the collector of conventional bipolar transistor. In the same way as in a bipolar transistor the holes injected from the emitter 14 either recombine with electrons in the base region or sink to the collector region 11. A certain base current is required to maintain the on-state of a bipolar transistor, because the majority carriers recombine in the base with the injected holes. The base current of the IGBT shown in FIG. 4 is supplied from the source 12 and is controlled by the gate which either induces the channel 18 and turns on the whole device or breaks the base circuit otherwise and therefore turns off the IGBT. The proposed device has a higher channel conductivity than a conventional device with a MOS-type gate and provides therefore a higher on-state current. Moreover, it has a higher temperature stability and a lower drift of parameters than an IGBT with a MOS-type gate due to the advantages of using a monocrystalline insulating material instead of an amorphous oxide.

The invention is of course not in any way restricted to the preferred embodiments described above, but many possibilities to modifications thereof will be apparent to a man with ordinary skill in the art.

As mentioned in the introduction the invention is applicable to all types of gate-controlled semiconductor devices having an insulated gate, and MIS (Metal-Insulator-Semiconductor) devices, i.e. unipolar semiconductor devices, and MIS-gate-controlled thyristors should be mentioned here as advantageous but not in any way limiting examples thereof.

As mentioned above it will be possible to use one or a combination of Group 3B-nitrides and SiC as insulating material according to the formula:

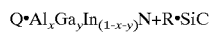

where $x+y \leq 1$, $Q \geq 0$ and $R \geq 0$. The lattice match with SiC decreases in the direction AlN, GaN and InN, so that it will in most cases be preferred to have a major part of insulating layer of AlN, at least close to the interface with the SiC semiconductor. However, it is well possible to have a composition changing with the distance from the interface, for example having only AlN as insulating material close to the interface and a portion of one or more of the other compounds distant from said interface and possibly varying with, the distance to the interface.

All definitions concerning the materials of the different device layers of course also include inevitable impurities as well as intensional doping when SiC is concerned.

The defition layer is to be interpreted broadly and comprise all types of volume extensions and shapes.

The definition "metal" in the claims and above is used only to denote the high metallic-type conductivity of primarily the gate electrode, and this gate electrode can for instance be attained by deposition of a metal, a metal silicide or a heavily doped polycrystalline on the insulating layer.

We claim:

1. A semiconductor device comprising:
   a semiconductor layer of crystalline SiC;
   an insulating layer arranged on said SiC layer;

a metal layer constituting a gate contact arranged directly on said insulating layer;

said insulating layer for insulating the SiC layer with respect to said gate contact, said gate being connectable to a voltage for creating a conducting surface channel at a SiC layer-insulating layer interface;

wherein at least a portion of the insulating layer closest to said interface is made of a crystalline material which is lattice-matched to SiC and has substantially the same coefficient of thermal expansion as SiC; and wherein said insulating material has AlN as the only component or as a major component of an alloy with insulating properties, and has a larger gap between the conduction band and the valence band than said semiconductor layer of SiC.

2. A device according to claim 1, wherein said material has placed next to the SiC of the semiconductor layer a higher energy level of a conduction band at said interface than an energy level of a conduction band of the SiC semiconductor at said interface.

3. A device according to claim 1, wherein said material has placed next to the SiC of the semiconductor layer a lower energy level of a valence band at said interface than an energy level of a valence band of the SiC semiconductor at said interface.

4. A device according to claim 1, wherein said material is AlN.

5. A device according to claim 1, wherein said material has a composition changing with a distance from said interface.

6. A device according to claim 1, wherein a whole insulating layer is made of said material.

7. A device according to claim 2, wherein said semiconductor layer is P-doped.

8. A device according to claim 3, wherein said semiconductor layer is N-doped.

9. a device according to claim 1, wherein said semiconductor layer is made of 6H-SiC.

10. A device according to claim 1, wherein said device is a bipolar device.

11. A device according to claim 10, being an IGBT.

12. A device according to claim 1, wherein said device is a unipolar device.

13. A device according to claim 1, wherein said semiconductor layer is a first layer arranged adjacent to and between a second semiconductor layer and a third semiconductor layer, wherein the insulating layer extends from the second semiconductor layer to the third semiconductor layers and wherein said gate voltage is adapted to create said surface channel at said interface between said second semiconductor layer and said third semiconductor layer.

14. A semiconductor device according to claim 1 wherein said semiconductor layer is made of monocrystalline SiC and said material is monocrystalline material.

* * * * *